US011923417B2

(12) United States Patent
Yu et al.

(10) Patent No.: US 11,923,417 B2
(45) Date of Patent: Mar. 5, 2024

(54) LATERAL BIPOLAR JUNCTION TRANSISTORS WITH A BACK-GATE

(71) Applicant: GlobalFoundries U.S. Inc., Malta, NY (US)

(72) Inventors: Hong Yu, Clifton Park, NY (US); Shesh Mani Pandey, Saratoga Springs, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 56 days.

(21) Appl. No.: 17/692,517

(22) Filed: Mar. 11, 2022

(65) Prior Publication Data

US 2023/0112235 A1   Apr. 13, 2023

Related U.S. Application Data

(60) Provisional application No. 63/287,656, filed on Dec. 9, 2021, provisional application No. 63/254,782, filed on Oct. 12, 2021.

(51) Int. Cl.
*H01L 29/10* (2006.01)
*H01L 21/8222* (2006.01)
(Continued)

(52) U.S. Cl.
CPC ...... *H01L 29/1008* (2013.01); *H01L 29/6625* (2013.01); *H01L 29/735* (2013.01);
(Continued)

(58) Field of Classification Search
CPC ............. H01L 29/1008; H01L 29/6625; H01L 29/735; H01L 29/66242; H01L 29/66265; H01L 29/737; H01L 29/0808; H01L 29/0821; H01L 29/7317; H01L 21/8222; H01L 27/082; H01L 29/0692
See application file for complete search history.

(56) References Cited

U.S. PATENT DOCUMENTS 6,949,764 B2   9/2005   Ning
8,288,758 B2   10/2012  Ning et al.
(Continued)

OTHER PUBLICATIONS

A. Ohata, Y. Bae, C. Fenouillet-Beranger and S. Cristoloveanu, "Mobility Enhancement by Back-Gate Biasing in Ultrathin SOI MOSFETs With Thin BOX," in IEEE Electron Device Letters, vol. 33, No. 3, pp. 348-350, doi: 10.1109/LED.2011.2181816 (Mar. 2012).

(Continued)

*Primary Examiner* — Mark W Tornow
*Assistant Examiner* — David Paul Sedorook
(74) *Attorney, Agent, or Firm* — Thompson Hine LLP; Francois Pagette

(57) ABSTRACT

Structures for a bipolar junction transistor and methods of forming a structure for a bipolar junction transistor. The structure includes a substrate having a well, a first terminal including a first raised semiconductor layer, a second terminal including a second raised semiconductor layer, and a base layer positioned in a lateral direction between the first raised semiconductor layer of the first terminal and the second raised semiconductor layer of the second terminal. The base layer has an overlapping arrangement with the well. The structure further includes a dielectric layer positioned in a vertical direction between the first terminal and the substrate, the second terminal and the substrate, and the base layer and the substrate.

20 Claims, 13 Drawing Sheets

(51) Int. Cl.
*H01L 27/082* (2006.01)
*H01L 29/66* (2006.01)
*H01L 29/735* (2006.01)
*H01L 29/737* (2006.01)

(52) U.S. Cl.
CPC ........ *H01L 21/8222* (2013.01); *H01L 27/082* (2013.01); *H01L 29/737* (2013.01)

(56) References Cited

U.S. PATENT DOCUMENTS

| | | |
|---|---|---|
| 8,420,493 B2 | 4/2013 | Ning et al. |
| 8,586,441 B1 * | 11/2013 | Cai ........................ H01L 29/161 257/E21.372 |
| 9,536,788 B1 | 1/2017 | Ning et al. |
| 10,825,921 B2 | 11/2020 | Balakrishnan et al. |
| 2005/0037582 A1 * | 2/2005 | Dennard ........... H01L 21/76256 438/296 |
| 2018/0269209 A1 * | 9/2018 | Tan ................... H01L 29/42328 |
| 2020/0286995 A1 * | 9/2020 | Hashemi ............... H01L 29/737 |
| 2021/0043733 A1 * | 2/2021 | Mueller-Meskamp ...................... H01L 27/1203 |
| 2021/0217849 A1 * | 7/2021 | Jain .................... H01L 27/1203 |

OTHER PUBLICATIONS

P. Magarshack, P. Flatresse and G. Cesana, "UTBB FD-SOI: A process/design symbiosis for breakthrough energy-efficiency," 2013 Design, Automation & Test in Europe Conference & Exhibition (DATE), pp. 952-957, doi: 10.7873/DATE.2013.200 (2013).

* cited by examiner

US 11,923,417 B2

LATERAL BIPOLAR JUNCTION TRANSISTORS WITH A BACK-GATE

CROSS-REFERENCE TO RELATED APPLICATIONS

This application claims the benefit of U.S. Provisional Patent Application No. 63/254,782, filed Oct. 12, 2021, and U.S. Provisional Patent Application No. 63/287,656, filed Dec. 9, 2021, which are hereby incorporated by reference herein in their entirety.

BACKGROUND

The disclosure relates generally to semiconductor devices and integrated circuit fabrication and, in particular, to structures for a bipolar junction transistor and methods of forming a structure for a bipolar junction transistor.

A bipolar junction transistor is a multi-terminal electronic device that includes an emitter, a collector, and an intrinsic base arranged between the emitter and collector. In an NPN bipolar junction transistor, the emitter and collector are comprised of n-type semiconductor material, and the intrinsic base is comprised of p-type semiconductor material. In a PNP bipolar junction transistor, the emitter and collector are comprised of p-type semiconductor material, and the intrinsic base is comprised of n-type semiconductor material. During operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials of the terminals have different energy bandgaps, which creates heterojunctions. For example, the collector and/or emitter of a heterojunction bipolar transistor may be constituted by silicon, and the intrinsic base of a heterojunction bipolar transistor may be constituted by silicon-germanium, which is characterized by a narrower band gap than silicon.

Improved structures for a bipolar junction transistor and methods of forming a structure for a bipolar junction transistor are needed.

SUMMARY

In an embodiment of the invention, a structure for a lateral bipolar junction transistor is provided. The structure comprises a substrate including a well, a first terminal including a first raised semiconductor layer, a second terminal including a second raised semiconductor layer, and a base layer positioned in a lateral direction between the first raised semiconductor layer of the first terminal and the second raised semiconductor layer of the second terminal. The base layer has an overlapping arrangement with the well. The structure further comprises a dielectric layer positioned in a vertical direction between the first terminal and the substrate, the second terminal and the substrate, and the base layer and the substrate.

In an embodiment of the invention, a method of forming a structure for a lateral bipolar junction transistor is provided. The method comprises forming a well in a substrate, forming a first terminal that includes a first raised semiconductor layer, forming a second terminal that includes a second raised semiconductor layer, and forming a base layer positioned in a lateral direction between the first raised semiconductor layer of the first terminal and the second raised semiconductor layer of the second terminal. The base layer has an overlapping arrangement with the well, and a dielectric layer is positioned in a vertical direction between the first terminal and the substrate, the second terminal and the substrate, and the base layer and the substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
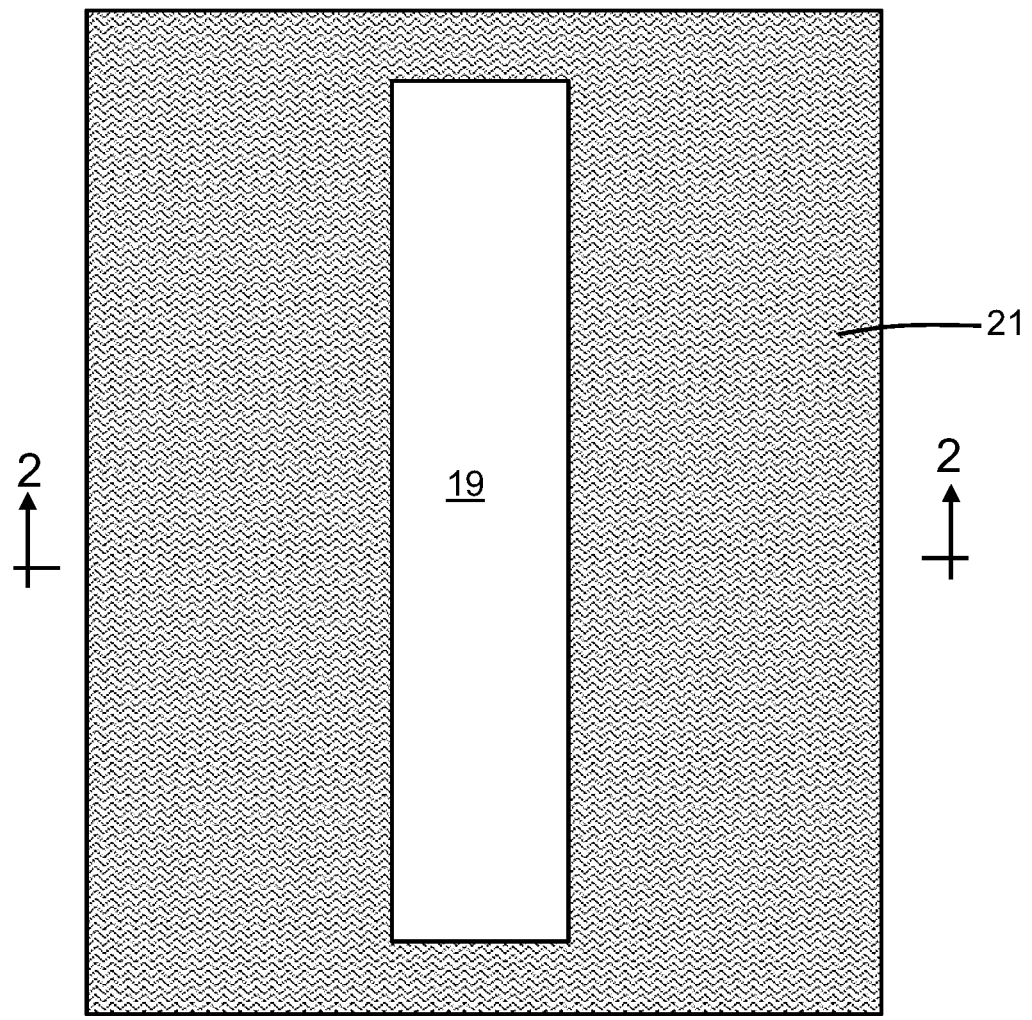
FIG. 1 is a top view of a structure at an initial fabrication stage of a processing method in accordance with embodiments of the invention.
Figure 2:
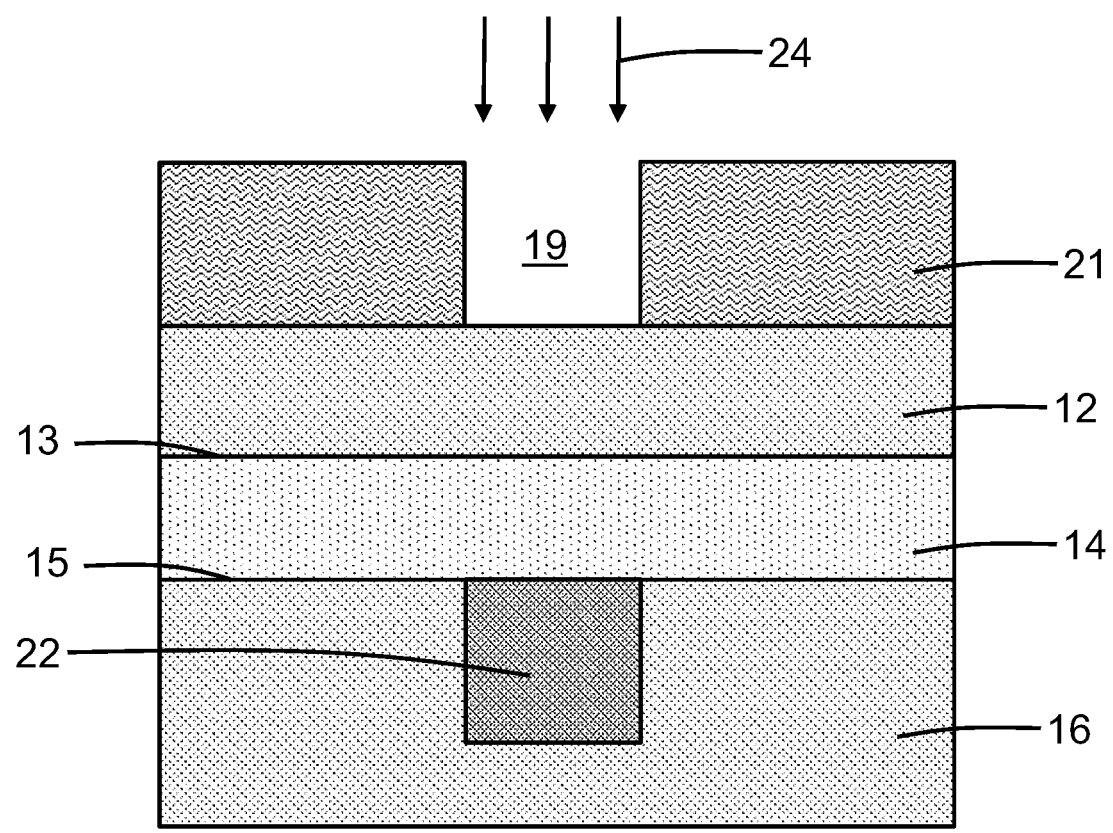
FIG. 2 is a cross-sectional view taken generally along line 2-2 in FIG. 1.

With reference to FIGS. 1, 2 and in accordance with embodiments of the invention, a semiconductor-on-insulator (SOI) substrate includes a device layer 12 defining a semiconductor layer, a dielectric layer 14, and a substrate 16. The device layer 12 is separated from the substrate 16 by the intervening dielectric layer 14 and is considerably thinner than the substrate 16. The device layer 12 may be comprised of a single-crystal semiconductor material, such as single-crystal silicon or single-crystal silicon-germanium, and may be doped to have, for example, p-type conductivity, and the dielectric layer 14 may be comprised of a dielectric material, such as silicon dioxide. The dielectric layer 14 has a lower interface 15 with the substrate 16 and an upper interface 13 with the device layer 12. The device layer 12 is electrically isolated from the substrate 16 by the dielectric layer 14. In an embodiment, the device layer 12 may have a thickness in a range of about 4 nanometers (nm) to about 10 nm, and the device layer 12 may be used to fabricate fully-depleted silicon-on-insulator (FDSOI) device structures.

A well 22 is formed in the substrate 16 by introducing a dopant, as diagrammatically indicated by the single-headed arrows 24, by ion implantation with a set of implantation conditions into the substrate 16. An implantation mask 21 comprised of an organic photoresist may be applied by a spin coating process, pre-baked, exposed to light projected through a photomask, baked after exposure, and developed with a chemical developer to define an opening 19 in the photoresist at the intended location for the well 22. The opening 19 in the implantation mask 21 determines, at least in part, the location and horizontal dimensions of the well 22. In that regard, the implantation mask 21 has a thickness and stopping power sufficient to block implantation of the device layer 12 and substrate 16 in masked areas. The implantation conditions (e.g., ion species, close, kinetic energy) may be selected to tune the electrical and physical characteristics of the well 22.

In an embodiment, the well 22 may be comprised of semiconductor material that is doped to have an opposite conductivity type from the substrate 16. In an embodiment, the well 22 may be comprised of semiconductor material that is doped with a concentration of an n-type dopant (e.g., arsenic or phosphorus) to provide n-type conductivity. The well 22 may provide a back-gate that can be used during device operation to electrically bias the lateral bipolar junction transistor. The well 22 may be coextensive with the interface 15 between the dielectric layer 14 and the substrate 16.

Figure 3:
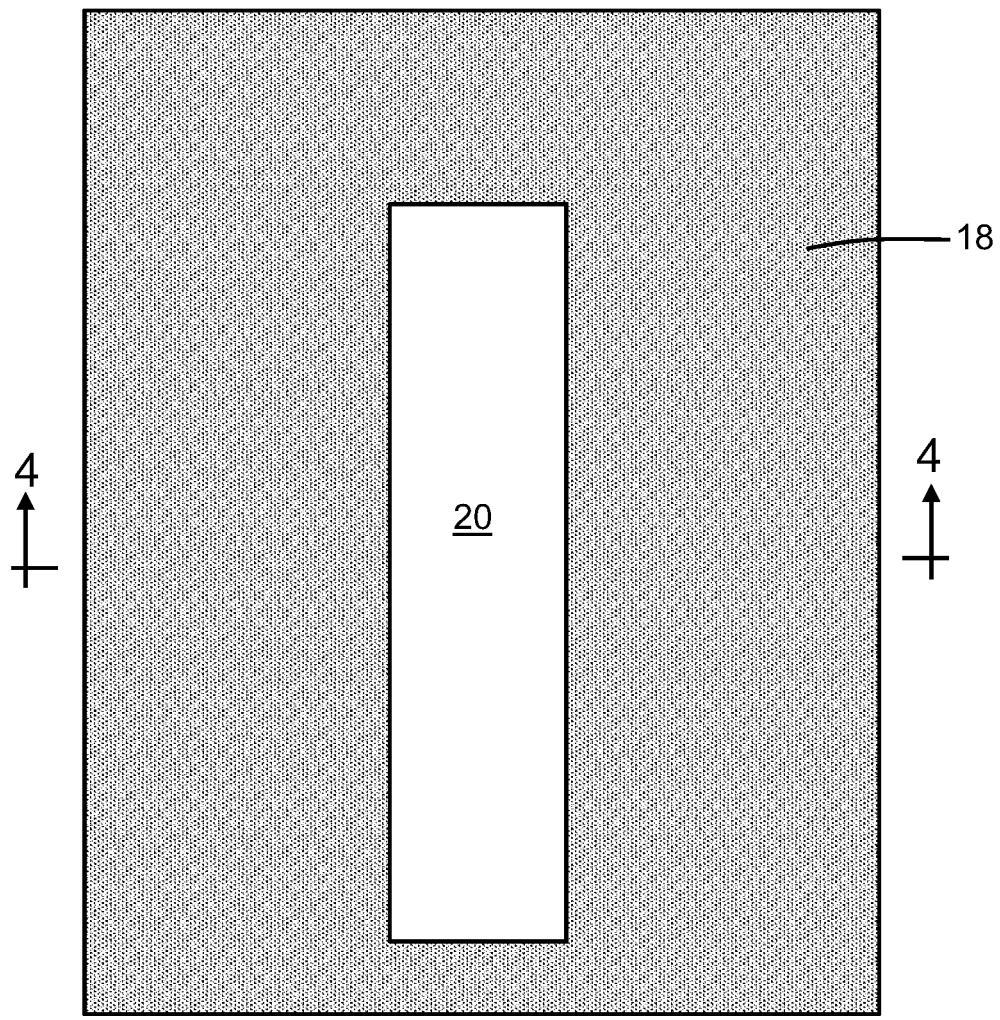
FIG. 3 is a top view of the structure at a fabrication stage subsequent to FIG. 1.
Figure 4:
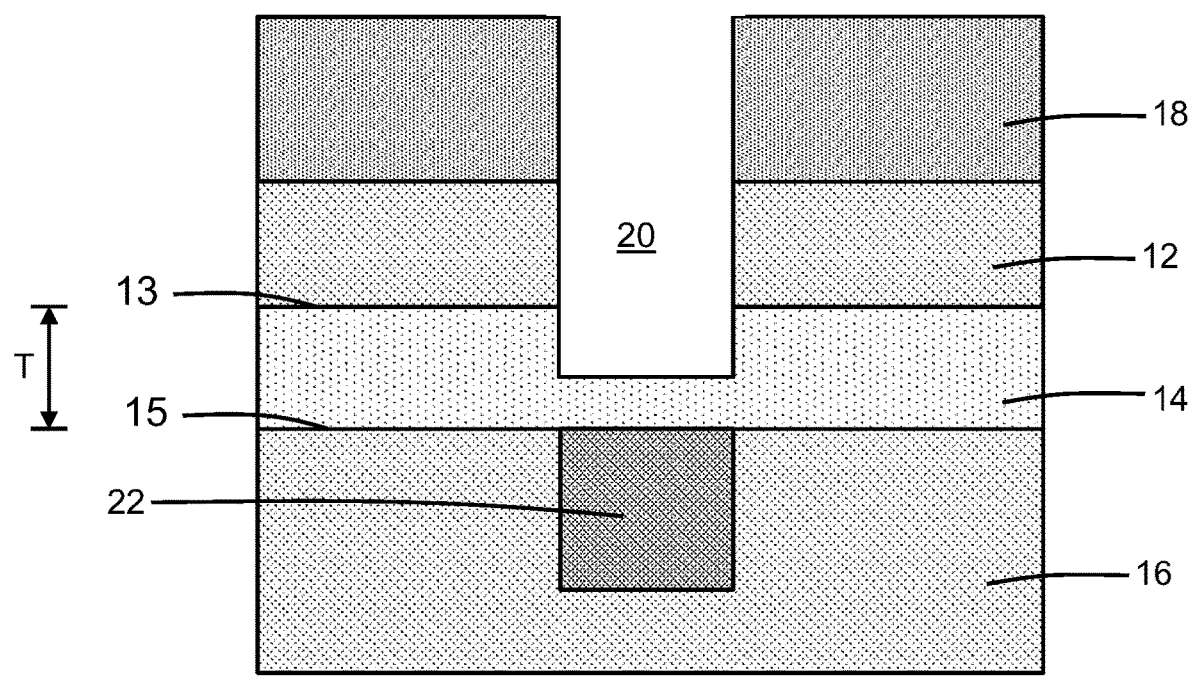
FIG. 4 is a cross-sectional view taken generally along line 4-4 in FIG. 3.

With reference to FIGS. 3, 4 in which like reference numerals refer to like features in FIGS. 1, 2 and at a subsequent fabrication stage, an opening 20 is formed by an etching process that penetrates fully through the device layer 12 and that may penetrate partially through the dielectric layer 14. To that end, a hardmask 18 is applied and patterned to form an opening that is positioned over a portion of the device layer 12 at the intended location for the opening 20. The hardmask 18 may be comprised of a dielectric material, such as silicon nitride, and may be patterned by lithography and etching processes. The opening 20 has a location and horizontal dimensions determined by the overlying opening in the hardmask 18. The opening 20 may be aligned longitudinally and widthwise with the well 22, but may be shorter in length than the well 22 to permit the well 22 to be subsequently contacted.

A lower portion of the opening 20 defines a recess in the dielectric layer 14. The recess extends partially through the dielectric layer 14 to a depth that is intermediate between the interface 15 and the interface 13. In an embodiment, the recess may extend through about one-half of the full layer thickness T of the dielectric layer 14. The section of the dielectric layer 14 at the location of the opening 20 has a diminished layer thickness (i.e., a reduced layer thickness) that is less than the layer thickness T of sections of the dielectric layer 14 adjacent to the recess.

Figure 5:
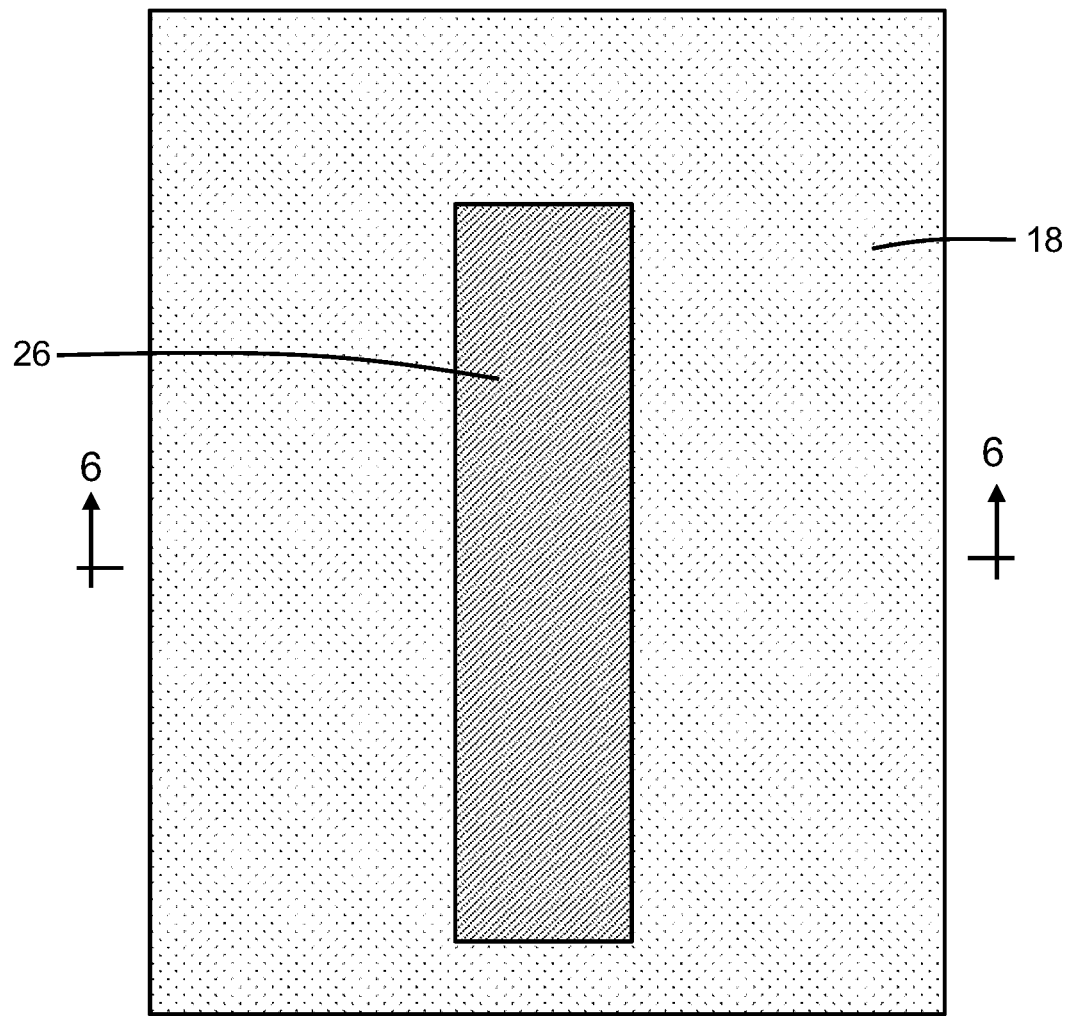
FIG. 5 is a top view of the structure at a fabrication stage subsequent to FIG. 3.
Figure 6:
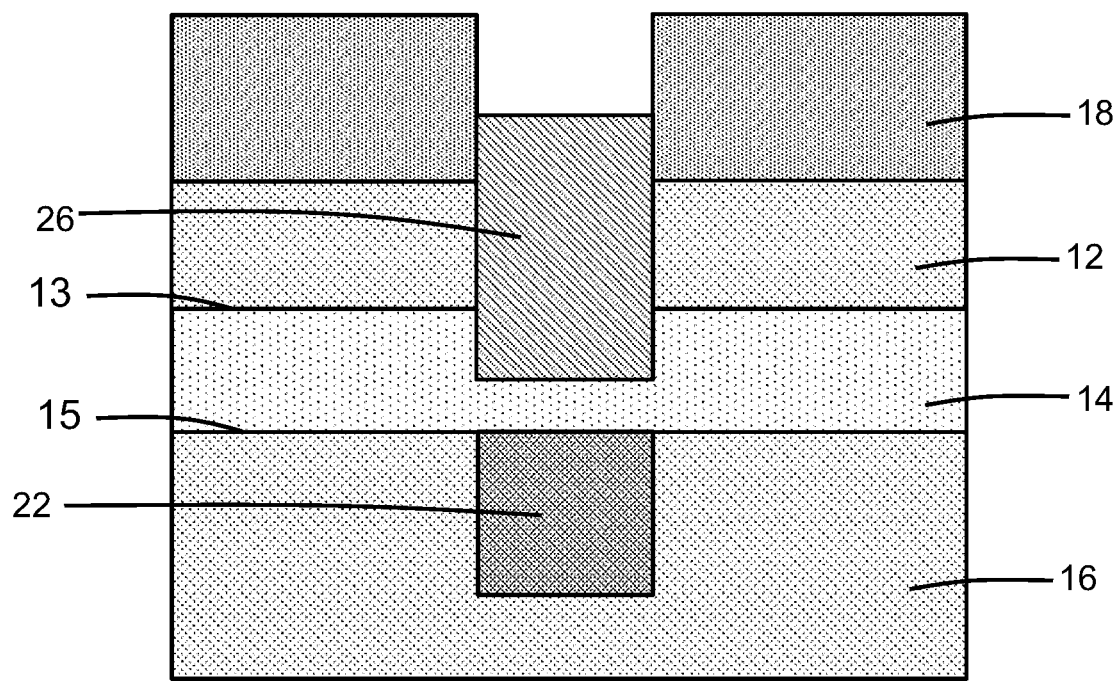
FIG. 6 is a cross-sectional view taken generally along line 6-6 in FIG. 5.

With reference to FIGS. 5, 6 in which like reference numerals refer to like features in FIGS. 3, 4 and at a subsequent fabrication stage, a base layer 26 of a lateral bipolar junction transistor is formed inside the opening 20 (FIGS. 3, 4). The base layer 26 may contain single-crystal semiconductor material that is epitaxially grown inside the opening 20. In that regard, the base layer 26 may be formed by the epitaxial growth of semiconductor material from the surfaces of the device layer 12 bordering the opening 20. In an embodiment, the semiconductor material of the base layer 26 may be comprised at least in part, or entirely, of silicon-germanium with the silicon content ranging from 95 atomic percent to 50 atomic percent and the germanium content ranging from 5 atomic percent to 50 atomic percent. In an alternative embodiment, the base layer 26 may be entirely comprised of silicon. The base layer 26 may be in situ doped during epitaxial growth with a concentration of a dopant, such as a p-type dopant (e.g., boron) that provides p-type conductivity.

A lower portion of the base layer 26 is positioned inside the recess in the dielectric layer 14 and is surrounded by (i.e., embedded in) the dielectric material of the dielectric layer 14. The lower portion of the base layer 26 inside the recess in the dielectric layer 14 may provide a sub-base of the lateral bipolar junction transistor that is separated from the well 22 by the dielectric material of the dielectric layer 14. An upper portion of the base layer 26, which is located above the device layer 12, may participate in forming an extrinsic base of the lateral bipolar junction transistor. A middle portion of the base layer 26, which is positioned in a vertical direction between the upper and lower portions and between the interfaces 13, 15, may provide an intrinsic base of the lateral bipolar junction transistor. The middle portion of the base layer 26 may directly contact the adjacent sections of the device layer 12.

The base layer 26 has an overlapping arrangement with the well 22. The well 22 is positioned in the substrate 16 beneath the base layer 26 in the overlapping arrangement and, in particular, adjacent to the lower portion of the base layer 26. The base layer 26 is longitudinally aligned with the well 22. In an embodiment, the base layer 26 and the well 22 may have approximately equal widths in a lateral direction.

Figure 7:
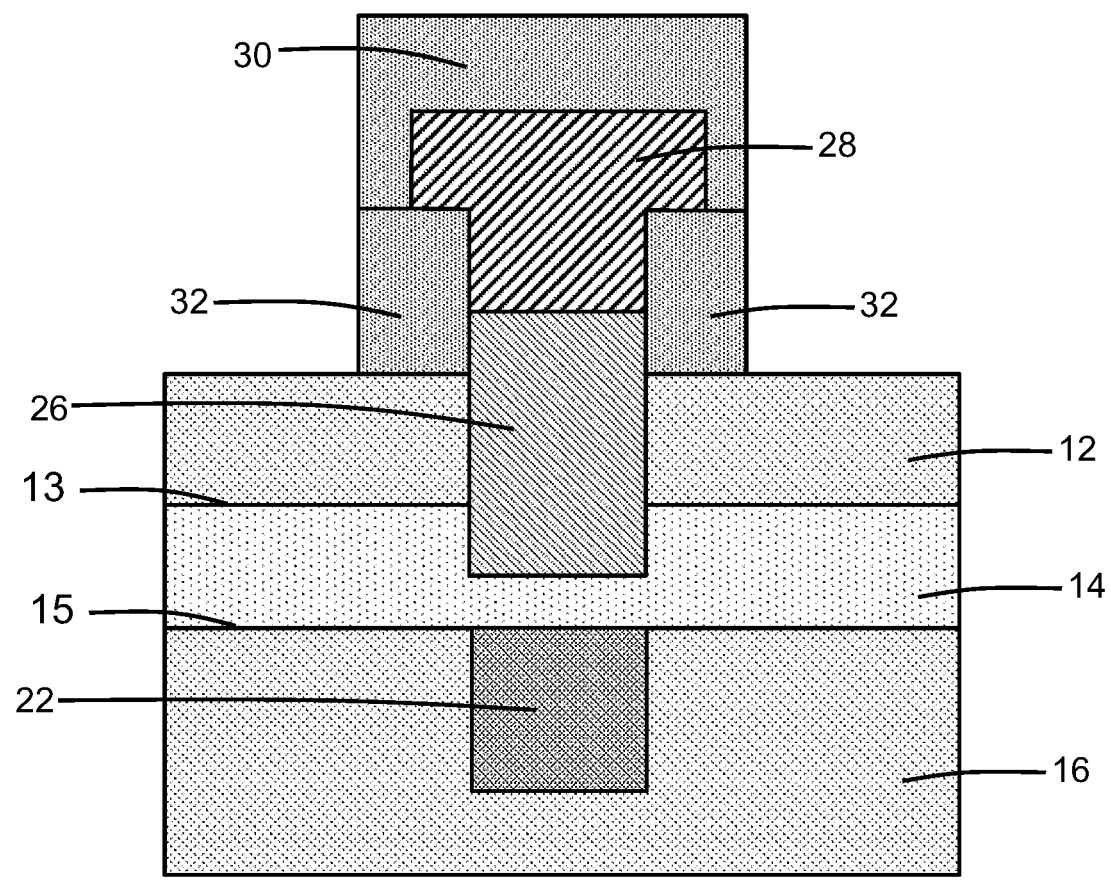
FIG. 7 is a cross-sectional view of the structure at a fabrication stage subsequent to FIG. 6.

With reference to FIG. 7 in which like reference numerals refer to like features in FIG. 6 and at a subsequent fabrication stage, a semiconductor layer 28 is deposited and patterned that includes a lower portion arranged in the opening 20 above the base layer 26 and an upper portion that protrudes from the opening 20. In an embodiment, the base layer 26 and the semiconductor layer 28 are doped to have the same conductivity type. In an embodiment, the semiconductor layer 28 may comprise polycrystalline silicon doped with a p-type dopant (e.g., boron) to provide p-type conductivity. A dielectric cap 30 is formed over the semiconductor layer 28, and sidewall spacers 32 may be patterned from the hardmask 18. The upper portion of the base layer 26 that is in contact with the semiconductor layer 28 may be heavily-doped during epitaxial growth and/or by dopant diffusion from the semiconductor layer 28. The semiconductor layer 28 and the upper portion of the base layer 26 may provide an extrinsic base of the lateral bipolar junction transistor.

Figure 8:
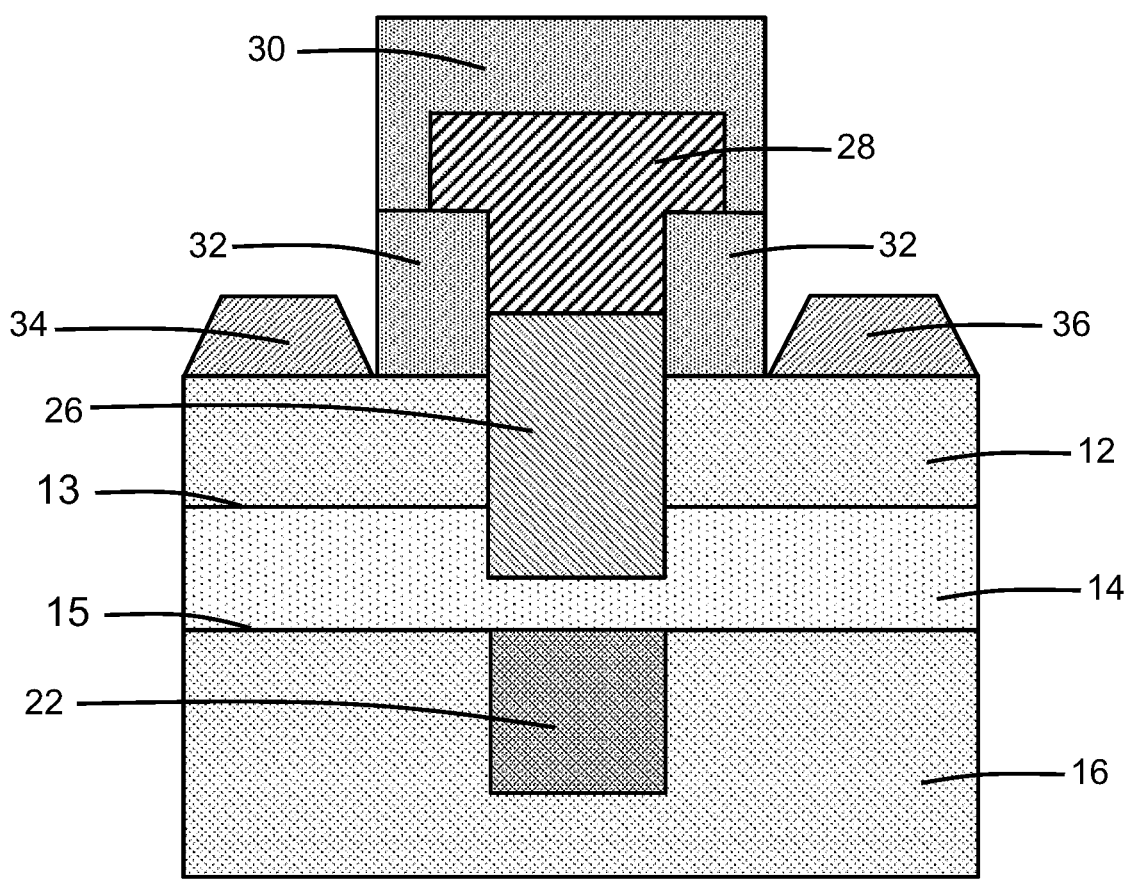
FIG. 8 is a cross-sectional view of the structure at a fabrication stage subsequent to FIG. 7.

With reference to FIG. 8 in which like reference numerals refer to like features in FIG. 7 and at a subsequent fabrication stage, semiconductor layers 34, 36 are formed as raised features on respective sections of the device layer 12 adjacent to the opposite sides of the base layer 26. The semiconductor layers 34, 36 may be comprised of a semiconductor material, such as silicon, and may be concurrently formed. The semiconductor layers 34, 36 may be doped (e.g., heavily doped) with a concentration of a dopant, such as an n-type dopant (e.g., arsenic or phosphorus) to provide n-type conductivity. The semiconductor layers 34, 36 may be formed using an epitaxial growth process and may contain single-crystal semiconductor material, such as single-crystal silicon. The epitaxial growth process may be selective resulting in epitaxial growth from exposed semiconductor material and not from exposed dielectric material. The crystal structure of the single-crystal semiconductor material of the device layer 12 serves as a crystalline template during epitaxial growth for the crystal structure of the single-crystal semiconductor material of the semiconductor layers 34, 36. The semiconductor layers 34, 36 and the respective underlying sections of the device layer 12 may provide terminals (i.e., an emitter and a collector) of the lateral bipolar junction transistor.

The sidewall spacers 32 are laterally positioned between the semiconductor layers 34, 36 and the base layer 26. Sections of the dielectric layer 14 are positioned in a vertical direction between the semiconductor layers 34, 36 and the substrate 16. The sections of the dielectric layer 14 beneath the semiconductor layers 34, 36 are thicker than the section of the dielectric layer 14 beneath the base layer 26 and between the lower portion of the base layer 26 and the substrate 16 in a vertical direction.

Figure 9:
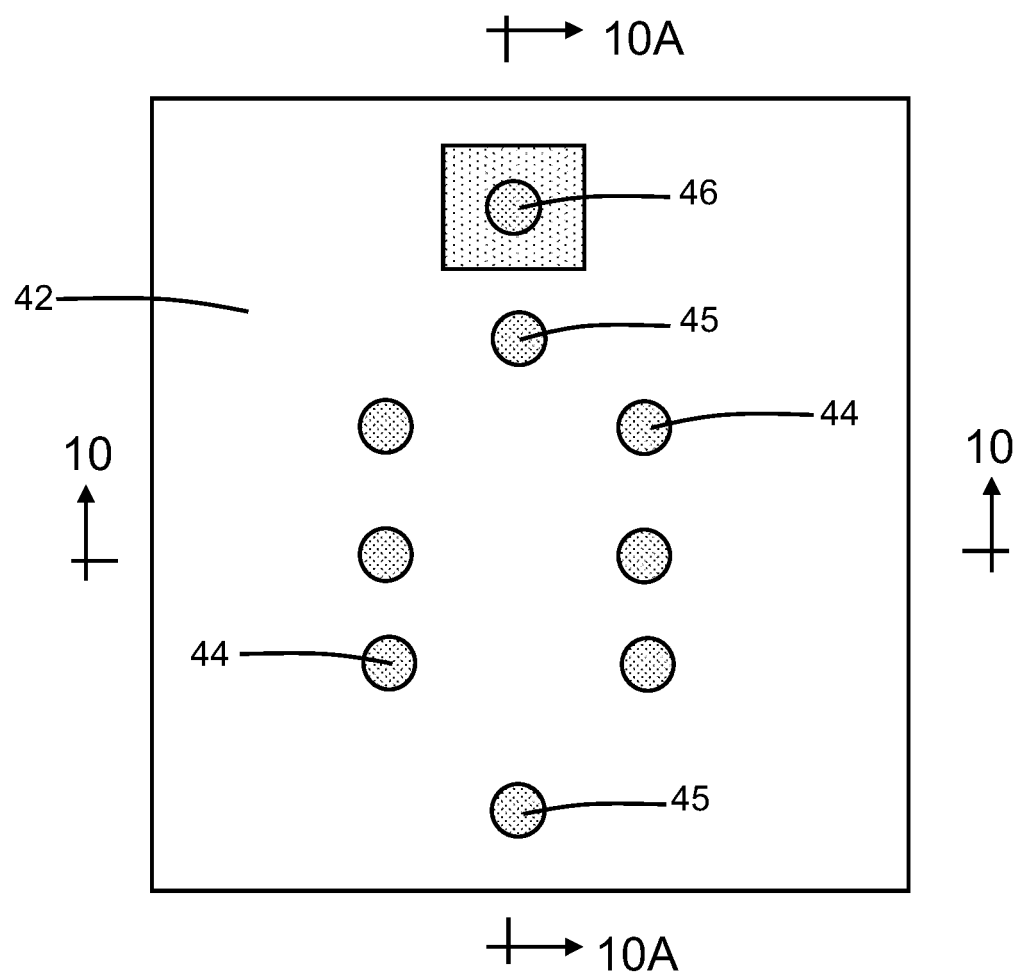
FIG. 9 is a top view of the structure at a fabrication stage subsequent to FIG. 8.
Figure 10:
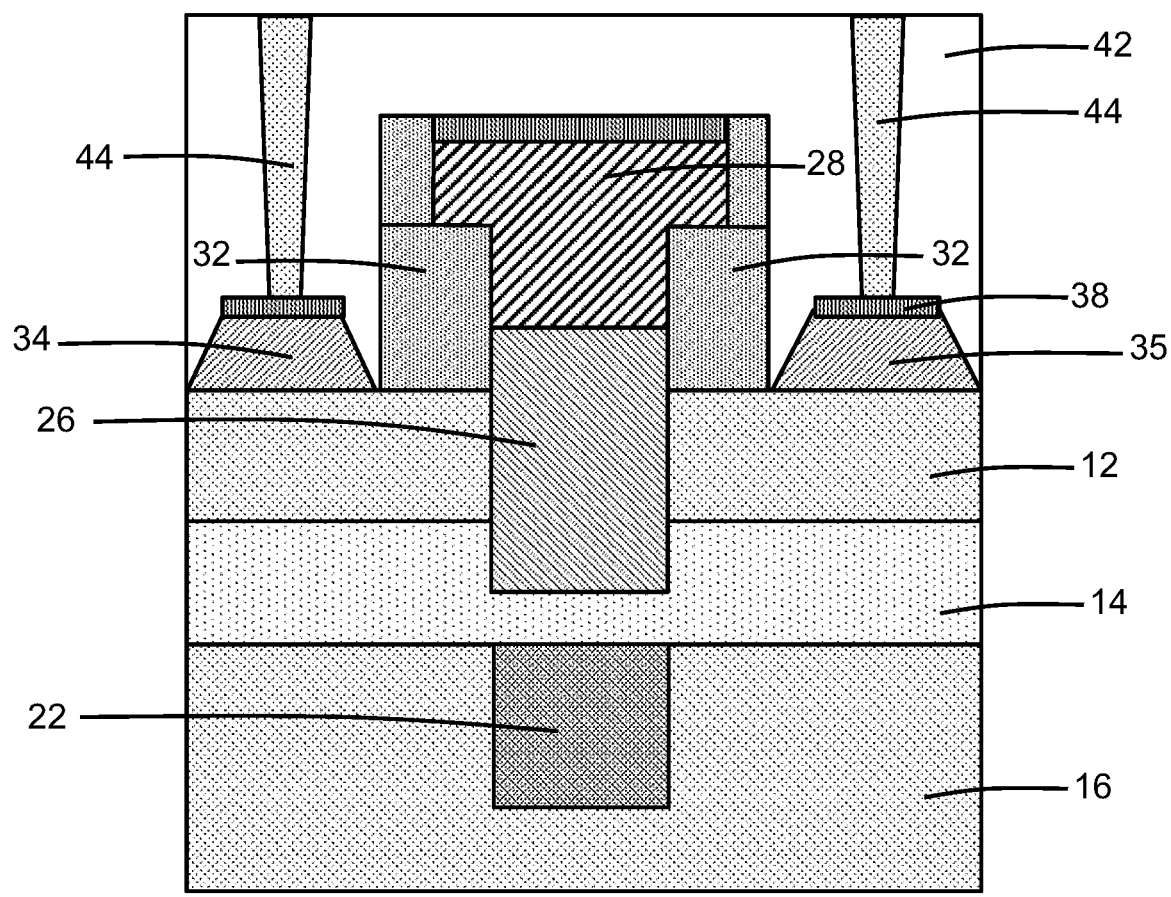
FIG. 10 is a cross-sectional view taken generally along line 10-10 in FIG. 9.
Figure 10A:
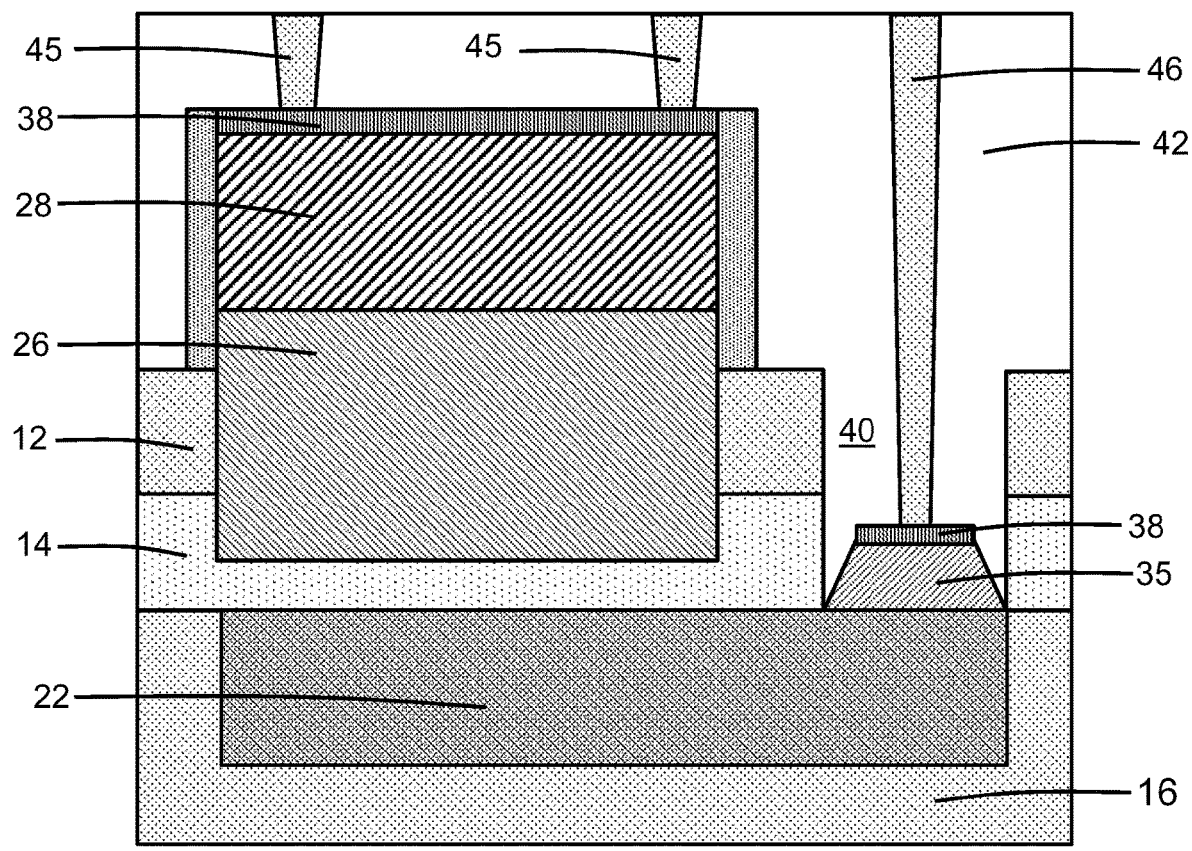
FIG. 10A is a cross-sectional view taken generally along line 10A-10A in FIG. 9.

With reference to FIGS. 9, 10, 10A in which like reference numerals refer to like features in FIG. 8 and at a subsequent fabrication stage, stacked sections of the device layer 12 and the dielectric layer 14 are removed adjacent to the lateral bipolar junction transistor to define an opening 40 that exposes a portion of the substrate 16. In an embodiment, the opening 40 may be defined before the semiconductor layers 34, 36 are formed such that a semiconductor layer 35 is concurrently formed on the exposed portion of the substrate 16 when the semiconductor layers 34, 36 are formed.

A silicide layer 38 is formed on the semiconductor layers 34, 35, 36 and on the semiconductor layer 28. A dielectric layer 42 is deposited and planarized, contacts 44 connected to the silicide layer 38 on the emitter and collector (i.e., semiconductor layers 34, 36) are formed, and a contact 45 connected to the silicide layer 38 on the extrinsic base (i.e., semiconductor layer 28) is formed. A back-gate contact 46 is also formed in the dielectric layer 42, and the back-gate contact 46 is connected to the silicide layer 38 on the semiconductor layer 36 on the exposed portion of the substrate 16. In an embodiment, the dielectric layer 42 may be comprised of a dielectric material, such as silicon dioxide, that is an electrical insulator. The contacts 44, 45, 46 may be comprised of a metal, such as tungsten.

The back-gate contact 46 includes a portion that is positioned inside the opening 40 penetrating through in the device layer 12 and the dielectric layer 14 to the semiconductor layer 35 on the substrate 16. The well 22 extends longitudinally beyond the base layer 26 to the opening 40.

The resultant device structure is a lateral bipolar junction transistor in which the emitter, base, and collector may be formed using a silicon-on-insulator substrate. The lateral bipolar junction transistor includes a raised emitter portion above another portion of the emitter in the device layer 12 and a raised collector portion above another portion of the collector in the device layer 12. A lower portion of the base layer 26, which may contain silicon-germanium, provides a sub-base that may extend into the recess defined in the dielectric layer 14 and may overlap with the well 22. The back-gate provided by the well 22 is connected with the back-gate contact 46, which may be used to electrically bias the well 22. The proximity of the lower portion of the base layer 26 to the well 22 may enhance the ability to apply the back-gate bias to the lateral bipolar junction transistor during operation. The proximity of the lower portion of the base layer 26 to the substrate 16 may also improve thermal dissipation such that the lateral bipolar junction transistor has a lowered operating temperature due to the diminished thickness of the dielectric material of the dielectric layer 14 between the base layer 26 and the substrate 16.

The lateral bipolar junction transistor may have a narrow base width defined by the width of the base layer 26, and the semiconductor layer 28 may be arranged over the base layer 26 and used to contact the narrower base layer 26. The lateral bipolar junction transistor may be formed using processes and masks used during CMOS processing. The lateral bipolar junction transistor may be characterized by a reduced base resistance, a lower base-emitter capacitance, a lower base-collector capacitance, and/or improvements in performance metrics such as Ft and Fmax.

Figure 11:
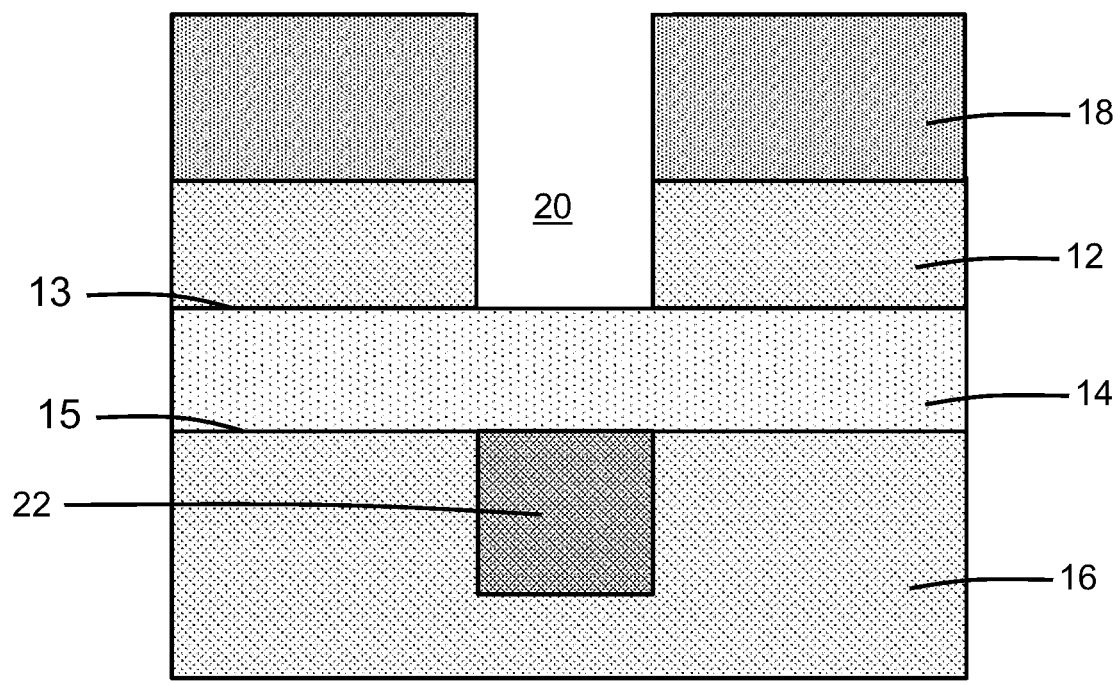
FIG. 11 is a cross-sectional view of a structure at an initial fabrication stage of a processing method in accordance with alternative embodiments of the invention.

With reference to FIG. 11 and in accordance with alternative embodiments of the invention, the opening 20 may be formed to penetrate only through the device layer 12 to the interface 13 between the device layer 12 and the dielectric layer 14. The opening 20, which lacks the recess, is fully arranged over and above the dielectric layer 14.

Figure 12:
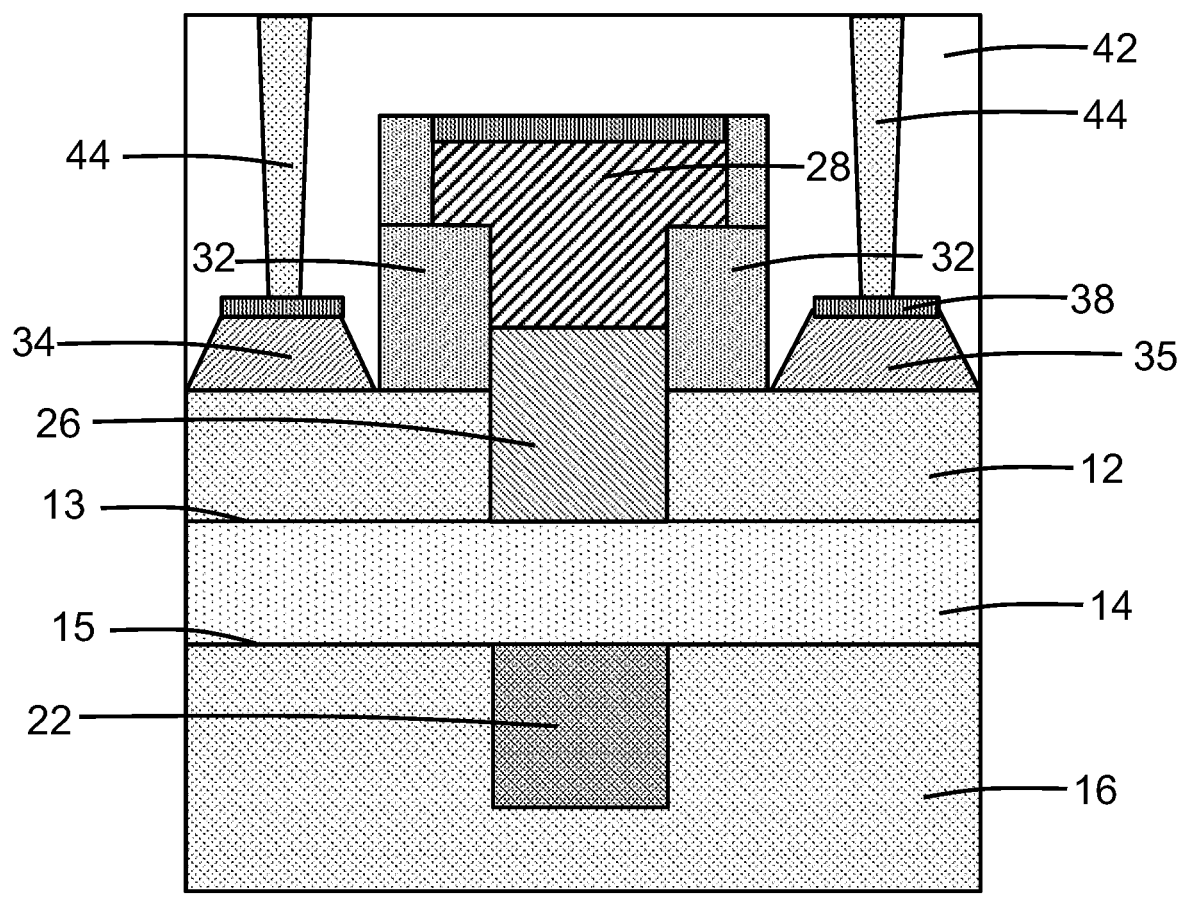
FIG. 12 is a cross-sectional view of the structure at a fabrication stage subsequent to FIG. 11.

With reference to FIG. 12 and in which like reference numerals refer to like features in FIG. 10 and at a subsequent fabrication stage, the base layer 26 is formed inside the opening 20 as previously described. The base layer 26 is fully arranged above the dielectric layer 14 and, in particular, fully above the interface 13. A lower portion of the base layer 26 may provide an intrinsic base of the lateral bipolar junction transistor and an upper portion of the base layer 26 may participate in forming the extrinsic base of the lateral bipolar junction transistor. The lower portion of the base layer providing the intrinsic base of the lateral bipolar junction transistor is positioned adjacent to the well 22 and is fully separated from the well 22 by the full thickness of the dielectric layer 14. In that regard, the lower portion of the base layer 26 may be coextensive with a directly-contacted portion of the dielectric layer 14.

Processing continues as previously described to complete the bipolar junction transistor.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a lateral bipolar junction transistor, the structure comprising:
    a substrate including a well;
    a first terminal including a first raised semiconductor layer;
    a second terminal including a second raised semiconductor layer;
    a base layer positioned in a lateral direction between the first raised semiconductor layer of the first terminal and the second raised semiconductor layer of the second terminal, the base layer having an overlapping arrangement with the well, and the base layer comprising silicon-germanium;
    a dielectric layer positioned in a vertical direction between the first terminal and the substrate, the second terminal and the substrate, and the base layer and the substrate; and
    a device layer comprising silicon, the device layer positioned on the dielectric layer, the device layer including a first section, a second section, and a first opening disposed in the lateral direction between the first section and the second section, and the first opening penetrating fully through the device layer,
    wherein the first raised semiconductor layer is positioned on the first section of the device layer, the second raised semiconductor layer is positioned on the second section of the device layer, and the base layer is positioned inside the first opening in the device layer.

2. The structure of claim 1 wherein the base layer is fully positioned above the dielectric layer.

3. The structure of claim 2 wherein the first opening penetrates fully through the device layer to the dielectric layer, and the base layer is coextensive with a portion of the dielectric layer.

4. The structure of claim 1 wherein the substrate has a first conductivity type, and the well has a second conductivity type opposite from the first conductivity type.

5. The structure of claim 1 further comprising:
    a contact coupled with the well.

6. The structure of claim 5 wherein the dielectric layer includes a second opening, and the contact includes a portion that is positioned inside the second opening.

7. The structure of claim 6 wherein the well is longitudinally aligned to the base layer, and the well extends longitudinally beyond the base layer to the second opening.

8. The structure of claim 7 wherein the well and the base layer have substantially equal widths in the lateral direction.

9. The structure of claim 1 wherein the well is longitudinally aligned to the base layer.

10. A structure for a lateral bipolar junction transistor, the structure comprising:
    a substrate including a well;
    a first terminal including a first raised semiconductor layer;
    a second terminal including a second raised semiconductor layer;
    a base layer positioned in a lateral direction between the first raised semiconductor layer of the first terminal and the second raised semiconductor layer of the second terminal, the base layer having an overlapping arrangement with the well; and
    a dielectric layer positioned in a vertical direction between the first terminal and the substrate, the second terminal and the substrate, and the base layer and the substrate,
    wherein the dielectric layer includes a recess aligned with the well, the recess penetrates partially through the dielectric layer, and the base layer includes a portion inside the recess.

11. The structure of claim 10 wherein the dielectric layer has a thickness, and the recess penetrates through about one-half of the thickness of the dielectric layer.

12. The structure of claim 10 further comprising:
    a device layer comprised of a semiconductor material, the device layer positioned on the dielectric layer,
    wherein the first raised semiconductor layer is positioned on a first section of the device layer, the second raised semiconductor layer is positioned on a second section of the device layer, and the base layer is positioned in an upper portion of the recess penetrating through the device layer between the first section of the device layer and the second section of the device layer.

13. The structure of claim 12 wherein the device layer comprises silicon, and the base layer comprises silicon-germanium.

14. A method of forming a structure for a lateral bipolar junction transistor, the method comprising:
    forming a well in a substrate;
    forming a first terminal that includes a first raised semiconductor layer;
    forming a second terminal that includes a second raised semiconductor layer; and
    forming a base layer positioned in a lateral direction between the first raised semiconductor layer of the first terminal and the second raised semiconductor layer of the second terminal,
    wherein the base layer has an overlapping arrangement with the well, a dielectric layer is positioned in a vertical direction between the first terminal and the substrate, the second terminal and the substrate, and the base layer and the substrate, a device layer is positioned on the dielectric layer, the device layer comprises silicon, the base layer comprises silicon-germanium, the first raised semiconductor layer is positioned on a first section of the device layer, the second raised semiconductor layer is positioned on a second section of the device layer, and the base layer is positioned in a first opening penetrating fully through the device layer between the first section of the device layer and the second section of the device layer.

15. The method of claim 14 wherein the first opening penetrates fully through the device layer to the dielectric layer, the base layer is fully positioned above the dielectric layer, and the base layer is coextensive with the dielectric layer.

16. The method of claim 14 further comprising:
forming a recess in the dielectric layer that is aligned with the well,
wherein the recess is a portion of the first opening, the recess penetrates partially through the dielectric layer, and the base layer includes a portion inside the recess.

17. The method of claim 14 wherein the substrate has a first conductivity type, and the well has a second conductivity type opposite from the first conductivity type.

18. The method of claim 14 further comprising:
forming a contact coupled with the well.

19. The method of claim 18 further comprising:
forming a second opening penetrating through the dielectric layer,
wherein the contact includes a portion that is positioned inside the second opening, the well is longitudinally aligned to the base layer, and the well extends longitudinally beyond the base layer to the second opening.

20. The method of claim 14 wherein the well is longitudinally aligned to the base layer.

\* \* \* \* \*